(12) United States Patent
Oi

(10) Patent No.: US 7,312,522 B2
(45) Date of Patent: Dec. 25, 2007

(54) MOUNTING MEMBER OF SEMICONDUCTOR DEVICE, MOUNTING CONFIGURATION OF SEMICONDUCTOR DEVICE, AND DRIVE UNIT OF SEMICONDUCTOR DEVICE

(75) Inventor: Kenichi Oi, Osaka (JP)

(73) Assignee: Espec Corp., Osaka (JP)

( * ) Notice: Subject to any disclaimer, the term of this patent is extended or adjusted under 35 U.S.C. 154(b) by 16 days.

(21) Appl. No.: 10/975,013

(22) Filed: Oct. 28, 2004

(65) Prior Publication Data

US 2005/0092988 A1　May 5, 2005

(30) Foreign Application Priority Data

Oct. 31, 2003　(JP)　............... 2003-373136

(51) Int. Cl.
*H01L 23/043* (2006.01)

(52) U.S. Cl. .................. 257/698; 257/48; 257/E23.078

(58) Field of Classification Search ................. 257/698
See application file for complete search history.

(56) References Cited

U.S. PATENT DOCUMENTS

| 5,633,598 | A | * | 5/1997 | Van Loan et al. | ........... 324/761 |
| 5,955,888 | A | * | 9/1999 | Frederickson et al. | ...... 324/761 |
| 6,043,669 | A | * | 3/2000 | Carroll | ........................ 324/761 |
| 6,154,863 | A | * | 11/2000 | Prokopp | ........................ 714/724 |
| 6,188,230 | B1 | * | 2/2001 | Birk | ............................ 324/754 |
| 6,359,452 | B1 | * | 3/2002 | Mozzetta | ..................... 324/754 |
| 6,489,790 | B1 | * | 12/2002 | An et al. | ..................... 324/755 |
| 6,541,991 | B1 | * | 4/2003 | Hornchek et al. | .......... 324/755 |
| 6,559,665 | B1 | * | 5/2003 | Barabi | ......................... 324/755 |
| 6,636,057 | B1 | * | 10/2003 | Uchikura | .................... 324/754 |
| 6,794,581 | B2 | * | 9/2004 | Smith et al. | ................ 174/260 |
| 6,974,335 | B1 | * | 12/2005 | Podpora | ...................... 439/71 |

FOREIGN PATENT DOCUMENTS

| JP | 04-118984 | 4/1992 |
| JP | 09-068557 | 3/1997 |

* cited by examiner

*Primary Examiner*—Minhloan Tran
*Assistant Examiner*—Eduardo A. Rodela
(74) *Attorney, Agent, or Firm*—Harness, Dickey & Pierce, P.L.C.

(57) ABSTRACT

A mounting member of a semiconductor device according to the present invention includes a wiring substrate to input and/or output actuating signals to a semiconductor device, a power supplying conductor plate to supply actuating power to the semiconductor device, and the GND conductor plate. The wiring substrate, the power supplying conductor plate, and the GND conductor plate are laminated with insulation films between respective layers. Input/output signals as well as minute driving current is supplied from wiring substrate, and the large main driving current is supplied through the power supplying conductor plate as well as the GND conductor plate.

1 Claim, 4 Drawing Sheets

MOUNTING MEMBER OF SEMICONDUCTOR DEVICE, MOUNTING CONFIGURATION OF SEMICONDUCTOR DEVICE, AND DRIVE UNIT OF SEMICONDUCTOR DEVICE

This Nonprovisional application claims priority under 35 U.S.C. § 119(a) on Patent Application No. 2003/373136 filed in Japan on Oct. 31, 2003, the entire contents of which are hereby incorporated by reference.

FIELD OF THE INVENTION

This invention is related to a drive unit of a semiconductor device in which a semiconductor chip is mounted on a substrate, and particularly to a drive unit of a semiconductor device in which a high-power semiconductor chip is mounted on a substrate, the high-power semiconductor chip whose current consumption is large.

BACKGROUND OF THE INVENTION

Actuating current in CPUs (Central Processing Unit) today tends to increase due to high integration caused by the growth in arithmetic capabilities. And, a leakage-current in a highly integrated CPU has been increasing due to the deterioration in insulation caused by miniaturization of circuit patterns or the like. This also causes the increasing of the current consumption in the CPU. Under the circumstances, semiconductor devices, for use in a power source for driving of devices, which consume a large current of more than 100 amperes have recently been developed.

It is commonly carried out to mount a semiconductor device, in which a CPU (semiconductor chip) is mounted on a device substrate, on a mounting board in a package style that is referred to as BGA (Ball Grid Array) or LGA (Land Grid Array).

A semiconductor device mounted based on the BGA or LGA has a large number of electrode pads arranged in a matrix manner on a rear surface of a device substrate (on a surface opposite to a mounting board). When the electrode pads are connected with corresponding predetermined electrode pads on the mounting board of a drive unit of the semiconductor device, it is possible to supply the power, connect to GND, and input/output processing signals Single-layered or multi-layered printed circuit board has been used conventionally as the mounting board. Wirings and electrode pads for actuating power supply, for GND, and for signal input/output are respectively formed on a wiring layer.

However, in an arrangement in which the wirings and the electrode pads for the actuating power supply, GND, and signal input-output are formed on a single wiring layer of the printed circuit board, the following problem arises. More specifically, the problem that a large current as operating power supply may not be supplied to the semiconductor device (high-power device) whose current consumption is large. This is because the conductor (copper foil) on the wiring layer has a thickness of 30 to 75 micrometers. This causes the problem that the printed circuit board itself generates heat, and/or is unable to follow the change in current consumption caused by the change in the operating conditions of the semiconductor device. This is because a conductor cross sectional area suitable for the driving current is not secured, and because a power loss increases proportionally as the square of the current value with respect to the conductor resistance.

An approach to provide a large current to a high-power device is that the printed circuit board (the mounting board) is formed in a multilayer manner, and a plurality of layers are exclusively used for the power supply and GND. In addition, unexamined Japanese patent publication No. 4-118984 (publication date: Apr. 20, 1992) discloses a mounting arrangement in which a wiring layer for signals and a power supply layer are provided in separate printed circuit boards, and in which the thickness of a conductor in the printed circuit board possessing the power supply layer is thickened.

Conventional high-power devices are not highly integrated, and they supply as power sources a current of not more than approximately 30 amperes. Actually, it is possible to supply current of not more than approximately 30 amperes by the conventional arrangement in which the printed circuit board (the mounting board) is formed in a multilayer manner, and a plurality of layers are exclusively used for the power supply and GND. However, the problem arises that a semiconductor device, which has been recently developed and consumes a large current of over 100 amperes, can not supply appropriate current even if the above conventional arrangement is adopted.

Thus, when supplying a large current of over 100 amperes to a semiconductor device, it is not possible to solve a problem such as the heat generation within the printed circuit board. This is because the power loss increases due to the thin conductor of not more than 70 micrometers in the printed circuit board. If it is intended to solve the problem of the current supply by making the printed circuit board to have more layers, then the cost of the printed circuit board will dramatically increase.

Moreover, the operating voltage of such a high-power device has been made lower these days to reduce the power consumption and/or the leakage current. This results in that a drop of the voltage to be supplied to the semiconductor device due to the resistance loss of the conductor is no longer tolerated.

Further, before shipment of a semiconductor device, it receives two kinds of tests. One is a test called a burn-in for finding initial failure, and the other is a test for distinguishing defectives from non-defectives. In the burn-in, a heavier load than in the ordinary use is supplied to the subject semiconductor device. Consequently, the current supply in the burn-in becomes larger than in the ordinary use. This gives rise to at least the following defects in the drive unit, of a burn-in apparatus, for supplying the actuating current to the semiconductor device. Namely, a DC power supply for compensating the voltage drop becomes bulky, and a cooling device for the heat generated becomes bulky.

SUMMARY OF THE INVENTION

An object of the present invention is to provide a drive unit of a semiconductor device enabling a stable supply of an actuating current to a high-power semiconductor device in which the actuating current exceeds 100 amperes.

In order to achieve the object, a mounting member of a semiconductor device in accordance with the present invention includes (i) a wiring substrate for inputting and/or outputting of actuating signals with respect to the semiconductor device, (ii) power supplying conductor plate and ground conductor plate for supplying a power source to the semiconductor device, and (iii) insulators, respectively provided between each layer of the wiring substrate, the power supplying conductor plate, and the ground conductor plate, the wiring substrate including electrode pads for inputting/ outputting of the actuating signals, the power supplying conductor plate and said ground conductor plate including connecting electrodes, and the electrode pads and the connecting electrodes being provided so as to, in a same mounting plane, correspond to an electrode layout in the semiconductor device.

By using the mounting member having the arrangement, the semiconductor device receives input/output signals (as well as the minute driving current) from the wiring substrate, and is driven by a large main driving current supplied from the power supplying conductor plate and the ground conductor plate.

Instead of using the wiring substrate layer of the wiring substrate, the power supplying conductor plate and the ground conductor plate respectively use thick conductor plates (for example, copper plates having a thickness of about 1 mm). Consequently, it is possible to secure a significantly larger conductor cross sectional area than a conventional one. This allows the resistance loss of the conductor to be minimized even when a large current is supplied. It is possible to swiftly follow any change in the current consumption due to any change in the operating condition, thereby stably supplying the power source.

Mounting configuration and drive unit of a semiconductor device according to the present invention will result in the same effects as those of the mounting member, by including a mounting member having the above arrangement.

Additional objects, features, and strengths of the present invention will be made clear by the description below. Further, the advantages of the present invention will be evident from the following explanation in reference to the drawings.

DESCRIPTION OF THE EMBODIMENTS

An embodiment according to the present invention is described below referring to the figures. The present embodiment deals with a case where the present invention is applied to a burn-in apparatus. Namely, note that the burn-in apparatus described below is deemed to fall within a drive unit of the semiconductor device in accordance with the present invention.

Figure 2A:
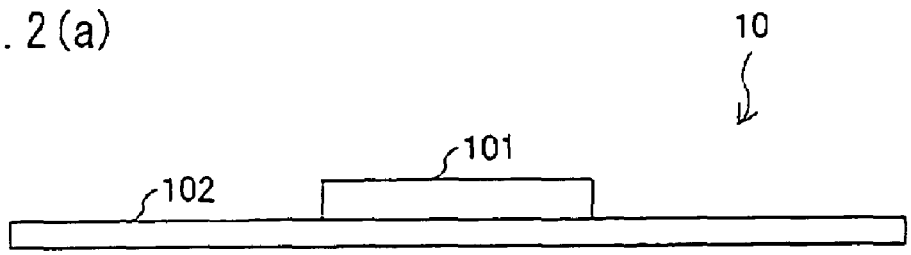
FIG. 2(a) is a side elevation showing how a semiconductor device is arranged.
Figure 2B:
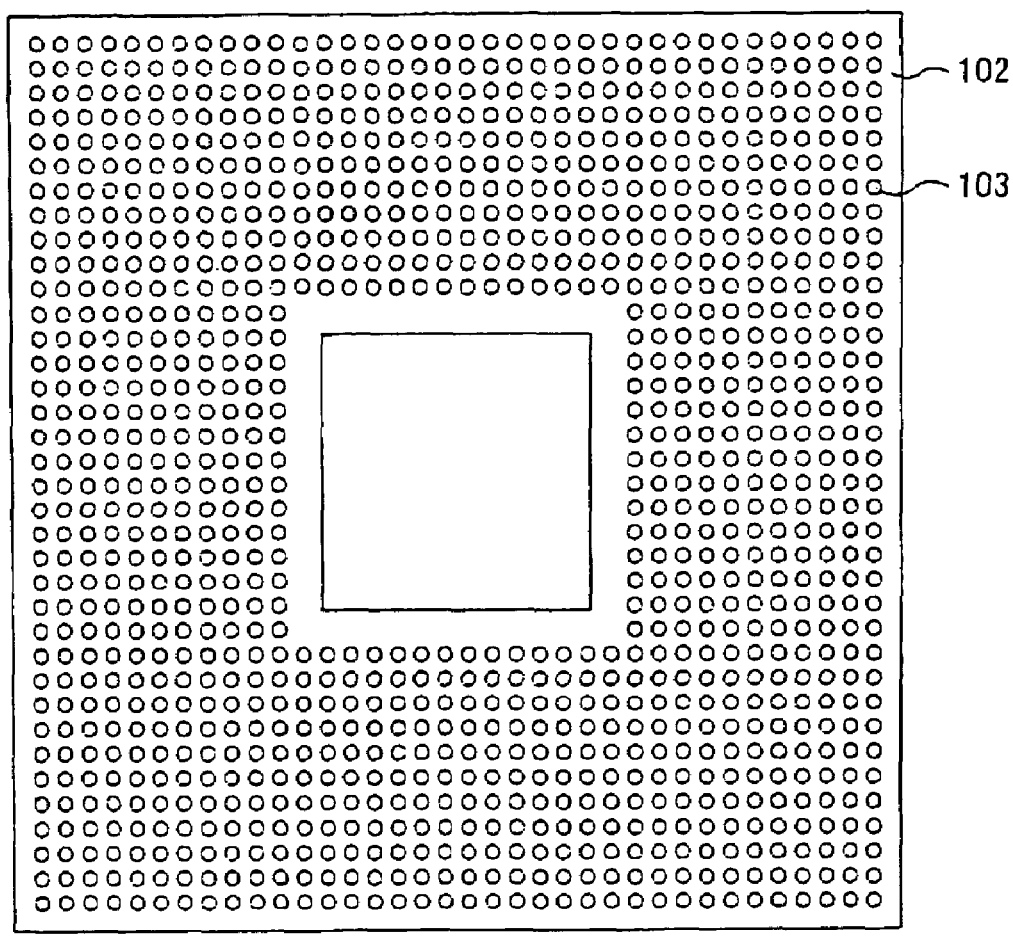
FIG. 2(b) is a bottom plan view showing how the semiconductor device is arranged.

First, how the semiconductor device is arranged is described referring to FIG. 2(a) and 2(b). As shown in FIG. 2(a), a semiconductor device 10 is arranged such that a semiconductor chip 101 is mounted on a device substrate 102. A large number of electrode pads 103 are formed, in a matrix manner, on a rear surface of the device substrate 102 (on a side opposite to a side where the semiconductor chip 101 is mounted). The electrode pads 103 are connected with a printed wiring on a front side of the device substrate 102 (on the side where the semiconductor chip 101 is mounted).

Note that the entire electrode pads 103 on the rear surface of the device substrate 102 are not necessarily used during the burn-in. For example, approximately 100 electrode pads are used for the power supply, approximately 100 electrode pads for GND, and approximately 100 electrode pads for the signal input/output.

Figure 1:
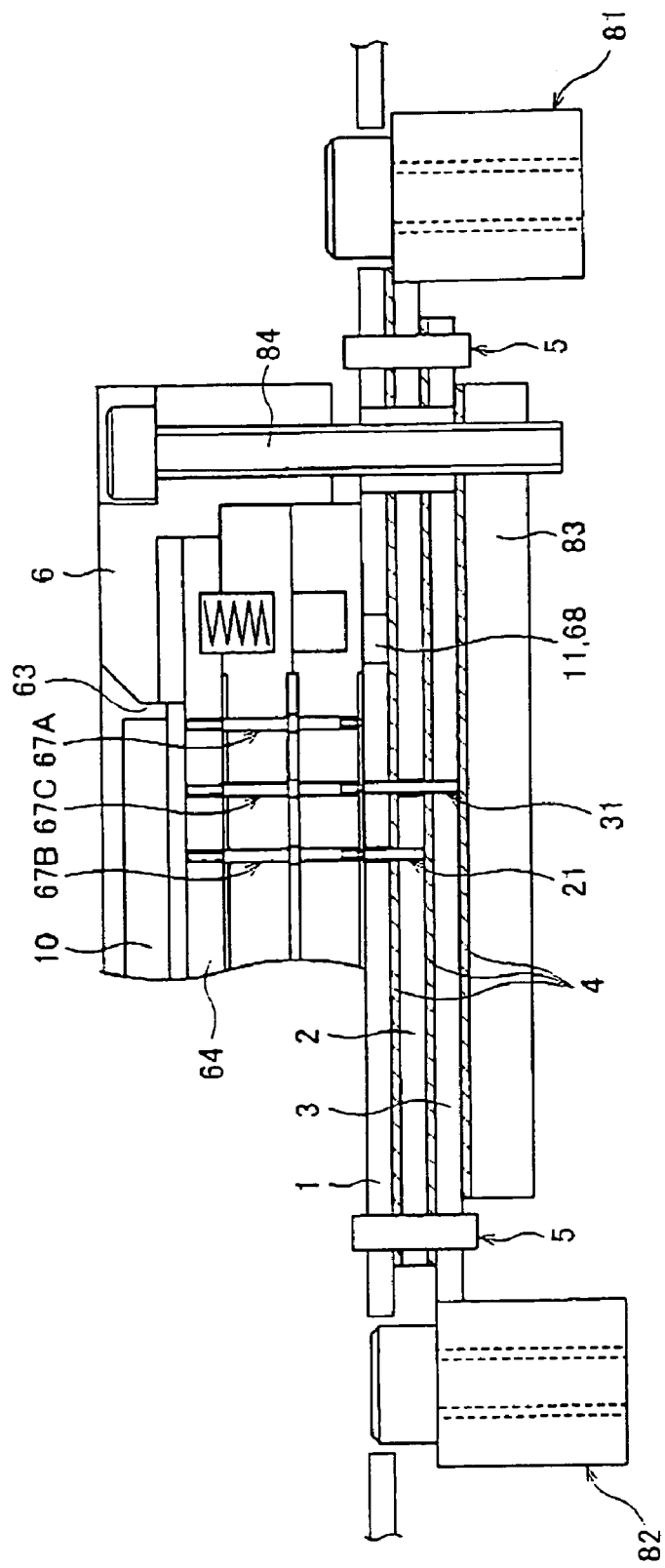
FIG. 1 shows an embodiment of the present invention, and is a cross sectional view showing how a main part of a burn-in apparatus is arranged.

Next, a burn-in apparatus for conducting the burn-in to the semiconductor device 10 is described referring to FIG. 1.

In place of a mounting board for supplying an actuating current to the semiconductor device 10, and for inputting and/or outputting of signals, the burn-in apparatus includes a burn-in substrate 1, a power supplying conductor plate 2, and a GND conductor plate 3.

The burn-in substrate 1 is a printed circuit board including circuits such as (i) a circuit for transmitting (1) actuating signals to be supplied to the semiconductor device 10, and (2) a power supply for one part of minute electric currents, and (ii) a monitoring circuit for monitoring of operating conditions of the semiconductor device 10.

The power supplying conductor plate 2 and the GND conductor plate 3 (each of the plates is a copper plate, for example) are exclusively provided for supplying the operating power source (operating voltage $V_{DD}$ and grounding voltage GND) to the semiconductor device 10. The power supplying conductor plate 2 and the GND conductor plate 3 respectively have a thickness of about 0.6 mm to 2.0 mm so as to restrain the resistance loss by reducing the conductor resistance. This is because the semiconductor device 10 is a high-power device whose actuating current is large.

The burn-in substrate 1, the power supplying conductor plate 2 and the GND conductor plate 3 are laminated such that insulation films (or insulation plates) 4 are provided between the burn-in substrate 1 and the power supplying conductor plate 2, and between the power supplying conductor plate 2 and the GND conductor plate 3, respectively. The lamination order is not limited to a specific one. However, in view of the necessity of realizing that the GND conductor plate 3 is thicker than the power supplying conductor plate 2, because a larger current flows in the GND conductor plate 3 than in the power supplying conductor plate 2, in cases where a single GND is shared by other power sources such as $V_{DD2}$ and $V_{DD3}$, it is preferable to laminate the burn-in substrate 1 (closest to the semiconductor device 10), the power supplying conductor plate 2, and the GND conductor plate 3 in this order. This allows pin-shaped conductors protruded from the lower conductor layer plate not to be long. In FIG. 1, the power supplying conductor plate 2 (the second layer), and the GND conductor plate 3 (the bottom layer) are laminated in this order.

Figure 3A:
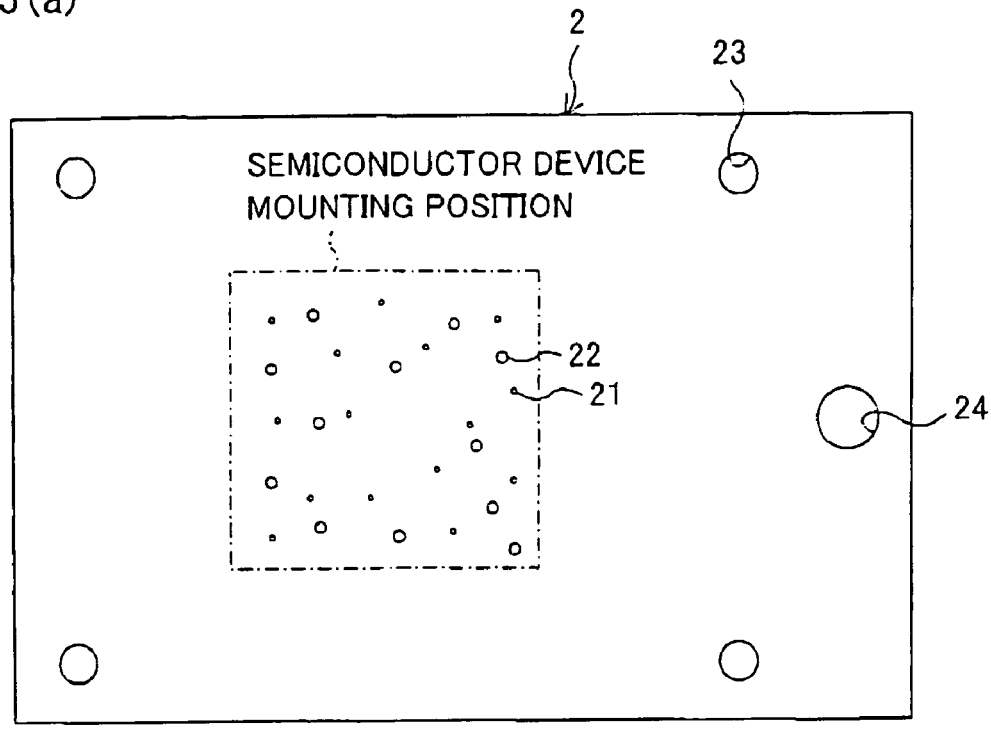
FIG. 3(a) is a plane view showing a power supplying conductor plate.
Figure 3B:
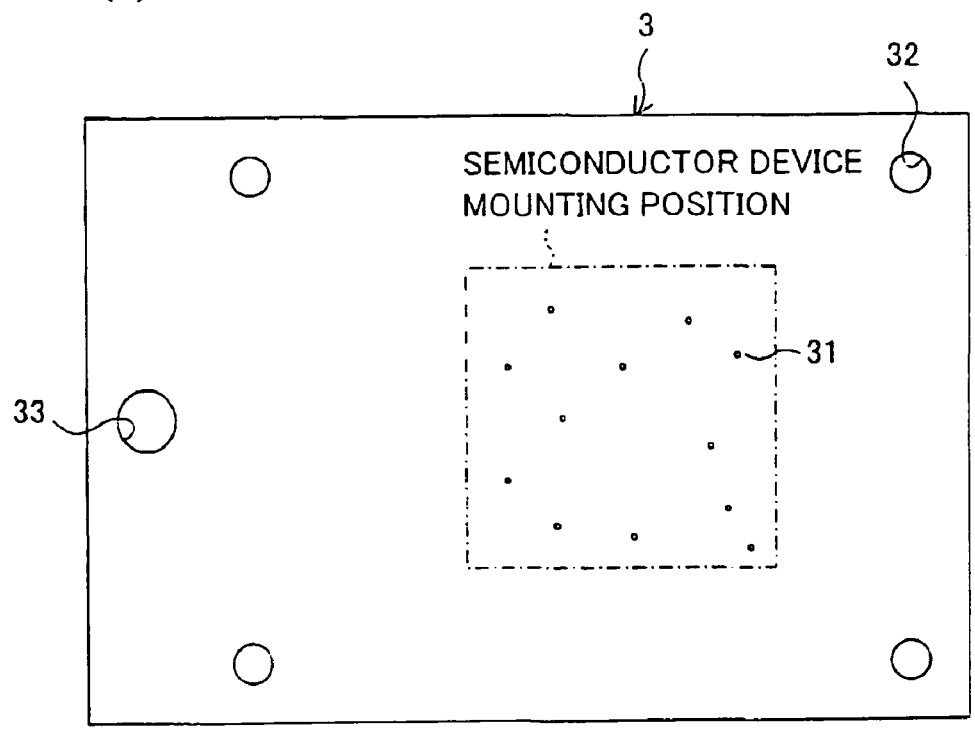
FIG. 3(b) is a plane view showing a GND conductor plate.

As shown in FIG. 3(a) and 3(b), the power supplying conductor plate 2 and the GND conductor plate 3 respectively include a large number of pin-shaped conductors 21 and 31 arranged by press fit so that the pin-shaped conductors 21 and 31 correspond to an electrode layout of the $V_{DD}$ and GND for the semiconductor device 10. Note that the number of the pin-shaped conductors are simplified in FIG. 3(a) and 3(b). Each of the pin-shaped conductors 21 and 31 has a length so that its top end and the top surface of the burn-in substrate 1 are in a same plane. A press fit portion is arranged so as not to exceed each thickness of the respective conductor plates 2 and 3. The power supplying conductor plate 2 further includes through-holes 22 with a diameter larger than that of the pin-shaped conductor 31. The through-holes 22 are provided so as to correspond to the respective pin-shaped conductors 31 of the GND conductor plate 3. The through-holes 22 are provided for causing the power supplying conductor plate 2 not to get into touch with the pin-shaped conductors 31 when laminating the power supplying conductor plate 2 and the GND conductor plate 3. Consequently, the through-holes 22 each provide clearance for securing the insulation between the power supplying conductor plate 2 and the pin-shaped conductor 31.

As for the method of carrying out press fit of the pin-shaped conductors 21 and 31 to the power supplying conductor plate 2 and the GND conductor plate 3, respectively, it is suitable (i) to create pin-holes by etching in the power supplying conductor plate 2 and the GND conductor plate 3, and (ii) to carry out the press fit of the pin-shaped conductors 21 and 31 in the pin-holes.

The pin-shaped conductors 21 and 31 penetrate the topmost burn-in substrate 1, with their top ends exposed in the same plane as the surface of the burn-in substrate 1. Note that no insulation clearance is necessary in penetrated parts corresponding with the pin-shaped conductors 21 and 31. This is because the burn-in substrate 1 itself is an insulative substrate. In other words, it is merely required that holes are provided so as to have such a diameter that causes the pin-shaped conductors 21 and 31 to penetrate their corresponding positions of the burn-in substrate 1. In this regard, each hole may have such a diameter that inner wall of the hole gets in touch with the pin-shaped conductors 21 and 31. In other words, it is merely required that the wiring layer is patterned so that conductors, served as other electrodes arranged on the surface of the burn-in substrate 1, are not exposed around the holes. Namely, it is merely required that the insulation is secured between the wiring layer of the burn-in substrate 1 and the pin-shaped conductors 21 and 31.

The burn-in substrate 1, the power supplying conductor plate 2, the GND conductor plate 3, and the insulation film 4 have positioning reference holes for lamination (see positioning reference holes 23, 32 in FIG. 3 (a) and 3(b) for the power supplying conductor plate 2, and the GND conductor plate 3), respectively. When insulated positioning pins 5 penetrates the positioning holes, it is possible to carry out a positioning in a in-plane direction of the substrate with accuracy.

Moreover, the power supplying conductor plate 2 and the GND conductor plate 3 include projected end parts that are not overlapped with each other in a lamination direction when positioning and laminating the burn-in substrate 1, the power supplying conductor plate 2, and the GND conductor plate 3. These projected end parts of the plates 2 and 3 have a power source connection hole 24 and a GND connection hole 33, respectively. The holes 23 and 24 are connected to a power source connecting section 81 and a GND connecting section 82 in the burn-in apparatus, respectively.

The following description deals with how the semiconductor device 10 is connected with a burn-in apparatus. In the burn-in apparatus of the present embodiment, a socket 6 is used for assisting in an electric connection of the burn-in apparatus to the semiconductor device 10. First, the following is a description as to how the socket 6 is arranged referring to FIG. 4(a) and 4(b).

Figure 4:
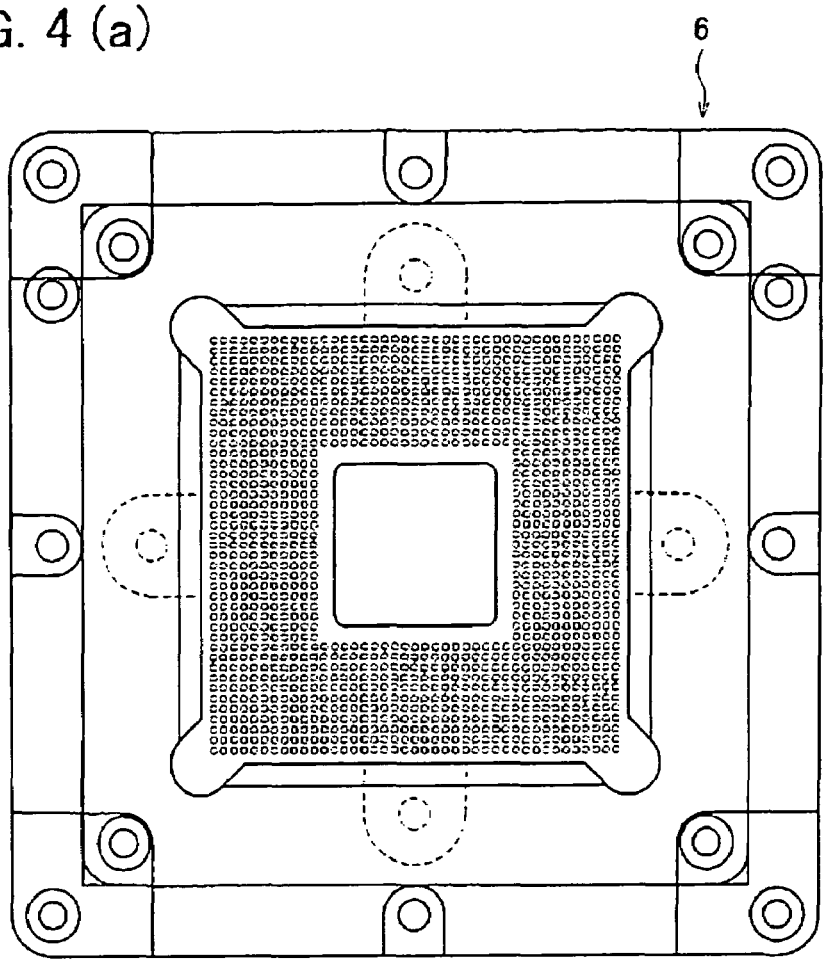
FIG. 4(a) is a plane view showing how a socket for use in the burn-in apparatus is arranged.
FIG. 4(b) is a side elevation showing how the socket is arranged.
Figure 4:
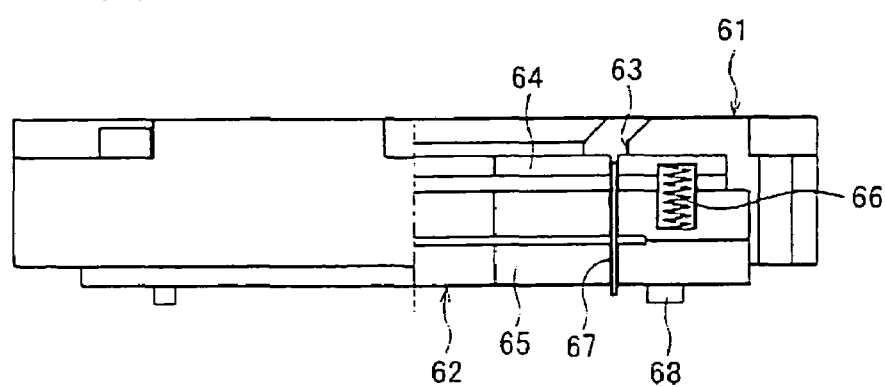

As shown in FIG. 4(b), the socket 6 mainly includes a head part 61 and a bottom table part 62. The head part 61 is provided for fixing the socket 6 on to the burn-in apparatus, and for setting the semiconductor device 10 that is subject to the burn-in process. A device frame 63 is provided on the head part 61, the device frame 63 having the same size as the semiconductor device 10.

According to the arrangement of the bottom table part 62, a device placing pedestal 64, on which the semiconductor device 10 is placed, is supported so as to float with respect to a base table section 65 via a spring 66. Moreover, according to the arrangement of the bottom table part 62, contact pins 67 with a bi-directional retractility penetrate the device placing pedestal 64 and the base table section 65, respectively. The contact pins 67 are, as shown in FIG. 4(a), arranged in a matrix manner at the same pitch as the electrode pads 103 on the bottom surface of the semiconductor device 10.

In addition, as shown in FIG. 4(a), the socket 6 with the contact pins 67 arranged in a matrix manner, it should be noted that the socket 6 is for general purpose because it can be used regardless of the electrode layout in the semiconductor device 10. Of course, the contact pins 67 can also be arranged only at necessary positions so as to correspond to an electrode layout in the semiconductor device 10. In this regard, a corresponding socket 6 should be fabricated while corresponding to the electrode layout in a semiconductor device 10. Then, the number of the contact pins 67 can be reduced, consequently reducing the fabrication costs of the socket 6.

The following description deals with how the semiconductor device 10 is mounted on the burn-in apparatus, when conducting the burn-in, referring to FIG. 1 once again.

The socket 6, the burn-in substrate 1, the power supplying conductor plate 2, and the GND conductor plate 3 are provided on a reinforcement table 83 of the burn-in apparatus in this order, and are fastened with bolts 84. It is preferable to use a metal table with such a high rigidity that the reinforcement table 83 avoids any deflection. When such a metal table is used, an insulation film 4 is provided between the GND conductor plate 3 and the reinforcement table 83. The power supplying conductor plate 2 and the GND conductor plate 3 are connected to the power terminal area 81 and the GND terminal area 82, respectively.

During the above provision and fastening, the positioning has been carried out by positioning pins 5 with respect to the burn-in substrate 1, the power supplying conductor plate 2, and the GND conductor plate 3. Note that a further positioning of the socket 6 should be carried out with respect to the burn-in substrate 1, the power supplying conductor plate 2, and the GND conductor plate 3, respectively. For this purpose, the socket 6 includes positioning projections 68 provided on a lower surface of the base table section 65. When the positioning projections 68 are fitted in the positioning holes 11 on the burn-in substrate 1, the socket 6 is positioned with respect to the burn-in substrate 1.

The semiconductor device 10, which is subject to the burn-in, is placed on the device placing pedestal 64 of the socket 6. This allows the semiconductor device 10 to fit into the device frame 63, thereby causing the semiconductor device 10 to receive the positioning with respect to the socket 6. The semiconductor device 10 thus processed is pressed downward by a press mechanism (not shown). This causes the device placing pedestal 64 to move downward, so that the electrode pads 103 on the lower surface of the semiconductor device 10 get in touch with the top ends of the contact pins 67, respectively.

The electrode pad 103 for the signal input/output in the semiconductor device 10 gets in touch with an electrode (not shown) on the burn-in substrate 1 via a contact pin 67A. The electrode pad 103 for the power supply gets in touch with the pin-shaped conductor 21 which is subject to the press-fit in the power supplying conductor plate 2 via a contact pin 67B. The electrode pad 103 for GND connection gets in touch with the pin-shaped conductor 31 which is subject to the press-fit in the GND conductor plate 3 via a contact pin 67C.

With the arrangement of the burn-in apparatus, the semiconductor device 10 receives input-output signals and minute drive current from the burn-in substrate 1, and is driven by a large main drive current supplied from the power supplying conductor plate 2 and the GND conductor plate 3. Instead of using the wiring layer of the printed circuit board, the power supplying conductor plate 2 and the GND conductor plate 3 use thick conductor plates (for example, copper plates having a thickness of about 1 mm). Consequently, it is possible to secure a significantly larger conductor cross sectional area than a conventional one. This allows the resistance loss of the conductor to be minimized even when a large current is supplied. It is possible to swiftly follow any change in the current consumption due to any change in the operating condition, thereby stably supplying the power source.

It should be noted that each thickness of the power supplying conductor plate 2 and the GND conductor plate 3 can be freely set. Consequently, even if a device that consumes a larger current with a lower operating voltage is developed in the future, it is possible to easily deal with such a future device by thickening the thickness of the conductor (or by increasing the number of the conductor layers). Further, the DC power supply and the cooling device of a burn-in apparatus can be miniaturized by applying the present invention to the burn-in apparatus.

The foregoing description deals with the case where the present invention is applied to the burn-in apparatus. However, the present invention is not limited to this. Namely, an application of the present invention to an ordinary general apparatus is also within the scope of the present invention. More specifically, it is possible to realize a mounting configuration in which a semiconductor device is mounted with the use of BGA (Ball Grid Array), LGA (Land Grid Array), or the like, instead of using a socket. This necessitates a mounting board, in a drive unit of the semiconductor device, which adopts an arrangement including a printed circuit board, a power supplying conductor plate, and a GND conductor plate. Alternatively, a socket can be used to mount a semiconductor device when the present invention is applied to a general apparatus.

Moreover, the foregoing description exemplifies the arrangement in which a single semiconductor device 10 is mounted on the mounting member including the burn-in substrate 1, the power supplying conductor plate 2, and the GND conductor plate 3. The present invention is, however, not limited to this, and the number of semiconductor device 10 to be mounted is not limited to a particular one. It is preferable in a burn-in apparatus that a plurality of semiconductor devices 10 can be mounted such that the burn-in is simultaneously carried out with respect to the plural semiconductor devices 10.

As described above, a mounting member of a semiconductor device in accordance with the present invention, includes (i) a wiring substrate for inputting and/or outputting of actuating signals to the semiconductor device, (ii) power supplying conductor plate and ground conductor plate for supplying a power source to the semiconductor device, and (iii) insulators, respectively provided between each layer of the wiring substrate, the power supplying conductor plate, and the ground conductor plate, the wiring substrate including electrode pads for inputting/outputting of the actuating signals, the power supplying conductor plate and said ground conductor plate including connecting electrodes, and the electrode pads and the connecting electrodes being provided so as to, in a same mounting plane, correspond to an electrode layout in the semiconductor device.

By using the mounting member having the arrangement, the semiconductor device receives input/output signals (as well as the minute drive current) from the wiring substrate, and is driven by a large main drive current supplied from the power supplying conductor plate and the ground conductor plate.

Instead of using the wiring substrate layer of the wiring substrate, the power supplying conductor plate and the ground conductor plate use thick conductor plates (for example, copper plates having a thickness of about 1 mm). Consequently, it is possible to secure a significantly larger conductor cross sectional area than a conventional one. This allows the resistance loss of the conductor to be minimized even when a large current is supplied. It is possible to swiftly follow any change in the current consumption due to any change in the operating condition, thereby stably supplying the power source.

In the mounting member of a semiconductor device, the wiring substrate, the power supplying conductor plate, and the ground conductor plate are provided such that the wiring substrate is closest to the mounting plane, the power supplying conductor plate and the ground conductor plate are subject to press-fit of pin-shaped conductors that penetrate the wiring substrate, and top ends of the pin-shaped conductors and the top surface of the wiring substrate are in a same plane.

Therefore, it is possible to realize a configuration for drawing the connecting electrodes, causing the semiconductor device to connect with the power supplying conductor plate and the ground conductor plate, respectively, up to the mounting plane.

In the arrangement, among pin-shaped conductors of the power supplying conductor plate and those of the ground conductor plate, the pin-shaped conductors that are subject to the press-fit in the conductor plate that is farther from the mounting plane should penetrate the other conductor. In this regard, it should be noted that the pin-shaped conductors are arranged so as to be insulated from the conductor plate which the pin-shaped conductors penetrate. This arrangement is easily realized by, for example, providing through holes with insulation clearances on the conductor plates which the pin-shaped conductors penetrate. And, the pin-shaped conductors of the power supplying conductor plate and the GND conductor plate are provided so as not to get in touch with a wiring layer of the wiring substrate.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A driving unit of a semiconductor device including a semiconductor chip mounted on a substrate, the driving unit comprising:

a mounting member, and a power source supplying section for supplying a power source, said mounting member including:

a wiring substrate for inputting and/or outputting of actuating signals with respect to the semiconductor device;

a power supplying conductor plate and a ground conductor plate for supplying a power source to said semiconductor device; and insulators, respectively provided between each of the wiring substrate, the power supplying conductor plate, and the ground conductor plate, said wiring substrate including electrode pads for inputting/outputting of the actuating signals, said power supplying conductor plate and said ground conductor plate including connecting electrodes, and the electrode pads and the connecting electrodes being provided so as to, in a same mounting plane, correspond to an electrode layout in the substrate of the semiconductor device, and said power source supplying section supplying the power source to said semiconductor device that is mounted on said mounting member, via the power supplying conductor plate and the ground conductor plate, wherein the wiring substrate, the power supplying conductor plate, and the ground conductor plate are provided such that the wiring substrate is closest to the mounting plane, the power supplying conductor plate and the ground conductor plate are subject to press-fit of pin-shaped conductors that penetrate the wiring substrate, and top ends of the pin-shaped conductors and the top surface of the wiring substrate are in a same plane.

* * * * *